United States Patent
Schubert et al.

(10) Patent No.: US 9,385,317 B2
(45) Date of Patent: Jul. 5, 2016

(54) MEMORY CELLS AND METHODS OF FORMING MEMORY CELLS

(71) Applicant: Micron Technology, Inc., Boise, ID (US)

(72) Inventors: Martin Schubert, Sunnyvale, CA (US); Shu Qin, Boise, ID (US); Scott E. Sills, Boise, ID (US); Durai Vishak Nirmal Ramaswamy, Boise, ID (US); Allen McTeer, Eagle, ID (US); Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/884,035

(22) Filed: Oct. 15, 2015

(65) Prior Publication Data

US 2016/0035974 A1    Feb. 4, 2016

Related U.S. Application Data

(60) Continuation of application No. 14/618,936, filed on Feb. 10, 2015, now Pat. No. 9,257,646, which is a division of application No. 14/070,407, filed on Nov. 1, 2013, now Pat. No. 8,981,334.

(51) Int. Cl.
*H01L 29/02* (2006.01)
*H01L 45/00* (2006.01)

(52) U.S. Cl.
CPC ............ *H01L 45/1608* (2013.01); *H01L 45/08* (2013.01); *H01L 45/085* (2013.01); *H01L 45/12* (2013.01); *H01L 45/1233* (2013.01); *H01L 45/1266* (2013.01); *H01L 45/146* (2013.01); *H01L 45/16* (2013.01)

(58) Field of Classification Search
CPC ......... H01L 31/00; H01L 29/12; H01L 45/00; G01K 7/00
USPC ................ 257/4, 211, 221; 438/382
See application file for complete search history.

(56) References Cited

U.S. PATENT DOCUMENTS

| | | | | |
|---|---|---|---|---|
| 6,767,866 B1* | 7/2004 | Ihara | ............... | H01L 39/126 257/E39.01 |
| 7,997,791 B2* | 8/2011 | Kund | ............... | G01K 3/005 374/102 |
| 8,115,282 B2* | 2/2012 | Mege | ............... | G11C 13/0011 257/179 |
| 8,420,481 B2* | 4/2013 | Mege | ............... | G11C 13/0011 257/179 |
| 9,177,916 B1* | 11/2015 | Barabash | ............... | H01L 23/528 |
| 2003/0052330 A1* | 3/2003 | Klein | ............... | C23C 18/165 257/154 |

(Continued)

FOREIGN PATENT DOCUMENTS

WO    WO    2/2016
PCT/US2014/047570

*Primary Examiner* — Caleb Henry
(74) *Attorney, Agent, or Firm* — Wells St. John P.S.

(57) ABSTRACT

Some embodiments include a memory cell having a first electrode, and an intermediate material over and directly against the first electrode. The intermediate material includes stabilizing species corresponding to one or both of carbon and boron. The memory cell also has a switching material over and directly against the intermediate material, an ion reservoir material over the switching material, and a second electrode over the ion reservoir material. Some embodiments include methods of forming memory cells.

10 Claims, 3 Drawing Sheets

(56) References Cited

U.S. PATENT DOCUMENTS

| | | | |
|---|---|---|---|
| 2004/0090815 A1 | 5/2004 | Tajiri | |
| 2005/0201143 A1 | 9/2005 | Pinnow et al. | |
| 2006/0043354 A1* | 3/2006 | Pinnow | C23C 14/0623 257/2 |
| 2006/0050598 A1* | 3/2006 | Rinerson | G11C 11/5685 365/232 |
| 2007/0007579 A1 | 1/2007 | Scheuerlein et al. | |
| 2007/0008773 A1* | 1/2007 | Scheuerlein | H01L 45/1675 365/161 |
| 2008/0023798 A1* | 1/2008 | Mege | G11C 13/0011 257/613 |
| 2008/0078985 A1* | 4/2008 | Meyer | G11C 13/02 257/6 |
| 2008/0253165 A1* | 10/2008 | Blanchard | B82Y 10/00 365/148 |
| 2008/0253168 A1* | 10/2008 | Blanchard | H01L 27/24 365/148 |
| 2008/0273370 A1* | 11/2008 | Keller | G11C 11/5614 365/148 |
| 2008/0314738 A1* | 12/2008 | Gopalakrishnan | C23C 18/1204 204/247.4 |
| 2008/0314739 A1* | 12/2008 | Gopalakrishnan | C23C 18/1204 204/247.4 |
| 2009/0028213 A1* | 1/2009 | Kund | G01K 3/005 374/178 |
| 2009/0039336 A1* | 2/2009 | Terao | G11C 11/5614 257/4 |
| 2009/0140233 A1* | 6/2009 | Kinoshita | G11C 5/02 257/4 |
| 2009/0213643 A1* | 8/2009 | Angerbauer | G11C 8/10 365/163 |
| 2009/0218567 A1* | 9/2009 | Mathew | H01L 45/085 257/52 |
| 2009/0242868 A1* | 10/2009 | Kurotsuchi | H01L 27/2436 257/4 |
| 2009/0272958 A1* | 11/2009 | Ufert | H01L 27/2409 257/2 |
| 2009/0296449 A1* | 12/2009 | Slesazeck | G11C 5/02 365/148 |
| 2010/0108975 A1* | 5/2010 | Sun | H01L 45/1233 257/4 |
| 2010/0110758 A1 | 5/2010 | Li | |
| 2010/0243983 A1* | 9/2010 | Chiang | G11C 13/0007 257/4 |
| 2010/0259960 A1* | 10/2010 | Samachisa | B82Y 10/00 365/51 |
| 2011/0012081 A1* | 1/2011 | Yoon | H01L 27/224 257/2 |
| 2011/0121254 A1* | 5/2011 | Dressler | H01L 45/085 257/4 |
| 2011/0140068 A1* | 6/2011 | Ozawa | H01L 27/249 257/4 |
| 2011/0180775 A1* | 7/2011 | Lin | H01L 45/144 257/4 |
| 2011/0207289 A1* | 8/2011 | Jeong | H01L 27/1021 438/433 |
| 2011/0233796 A1* | 9/2011 | Kim | H01L 27/2409 257/786 |
| 2012/0032132 A1* | 2/2012 | Lee | H01L 27/2409 257/4 |
| 2012/0104341 A1* | 5/2012 | Mege | G11C 13/0011 257/2 |
| 2012/0145987 A1* | 6/2012 | Sei | H01L 45/08 257/5 |
| 2012/0176831 A1* | 7/2012 | Xiao | G11C 13/0007 365/148 |
| 2012/0236625 A1* | 9/2012 | Ohba | H01L 27/2436 365/148 |
| 2012/0295398 A1* | 11/2012 | Kurunczi | H01L 45/165 438/104 |
| 2013/0128649 A1* | 5/2013 | Quick | H01L 45/085 365/148 |
| 2013/0200329 A1* | 8/2013 | Mege | G11C 13/0011 257/4 |
| 2013/0334483 A1* | 12/2013 | Ramaswamy | H01L 45/08 257/2 |
| 2014/0097397 A1* | 4/2014 | Park | H01L 45/04 257/4 |
| 2014/0141590 A1* | 5/2014 | Smythe, III | H01L 45/145 438/382 |
| 2014/0254242 A1 | 9/2014 | Siau | |
| 2014/0264225 A1* | 9/2014 | Arayashiki | H01L 45/085 257/2 |
| 2014/0284536 A1* | 9/2014 | Arayashiki | H01L 45/085 257/2 |
| 2014/0312986 A1 | 10/2014 | Edelstein et al. | |
| 2014/0353573 A1 | 12/2014 | Kalra et al. | |
| 2015/0123065 A1* | 5/2015 | Petz | H01L 45/085 257/4 |

* cited by examiner

MEMORY CELLS AND METHODS OF FORMING MEMORY CELLS

RELATED PATENT DATA

This patent resulted from a continuation of U.S. patent application Ser. No. 14/618,936, which was filed Feb. 10, 2015, and which is hereby incorporated herein by reference; which resulted from a divisional of U.S. patent application Ser. No. 14/070,407, which was filed Nov. 1, 2013, which issued as U.S. Pat. No. 8,981,334, and which is hereby incorporated herein by reference.

TECHNICAL FIELD

Memory cells and methods of forming memory cells.

BACKGROUND

Integrated memory may be used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory cell is a programmable metallization cell (PMC). Such may be alternatively referred to as conductive bridging random access memory (CBRAM), nanobridge memory, or electrolyte memory. A PMC may use ion conductive switching material (for instance, a suitable chalcogenide or any of various suitable oxides) and an ion reservoir material proximate the switching material. The ion reservoir material and switching material may be provided between a pair of electrodes. A suitable voltage applied across the electrodes can cause ions to migrate from the ion reservoir material into the switching material to thereby create one or more current-conductive paths through the switching material. An opposite voltage applied across the electrodes essentially reverses the process and thus removes the current-conductive paths. A PMC thus comprises a high resistance state (corresponding to the state lacking a conductive bridge extending through a switching material) and a low resistance state (corresponding to the state having the conductive bridge extending through the switching material), with such states being reversibly interchangeable with one another.

Although there has been effort toward development of PMCs and other memory cells, there remains a need for improved memory cells.

DETAILED DESCRIPTION OF THE ILLUSTRATED EMBODIMENTS

A performance aspect of PMCs can be conductivity through the electrodes, with higher conductivity electrodes being desired. Another performance aspect can be stability of a conductive bridge. Some embodiments provided herein utilize an intermediate material between a switching material and an adjacent electrode to enable characteristics of a memory cell to be tailored to achieve a desired balance between conductive bridge stability and electrode conductivity. The intermediate material comprises one or both of carbon and boron. The intermediate material may improve reliability of the memory cell as compared to conventional memory cells, may improve memory state retention, and may improve durability of the memory cell as compared to conventional memory cells. Example embodiments are described with reference to FIGS. 1-7.

Figure 1:
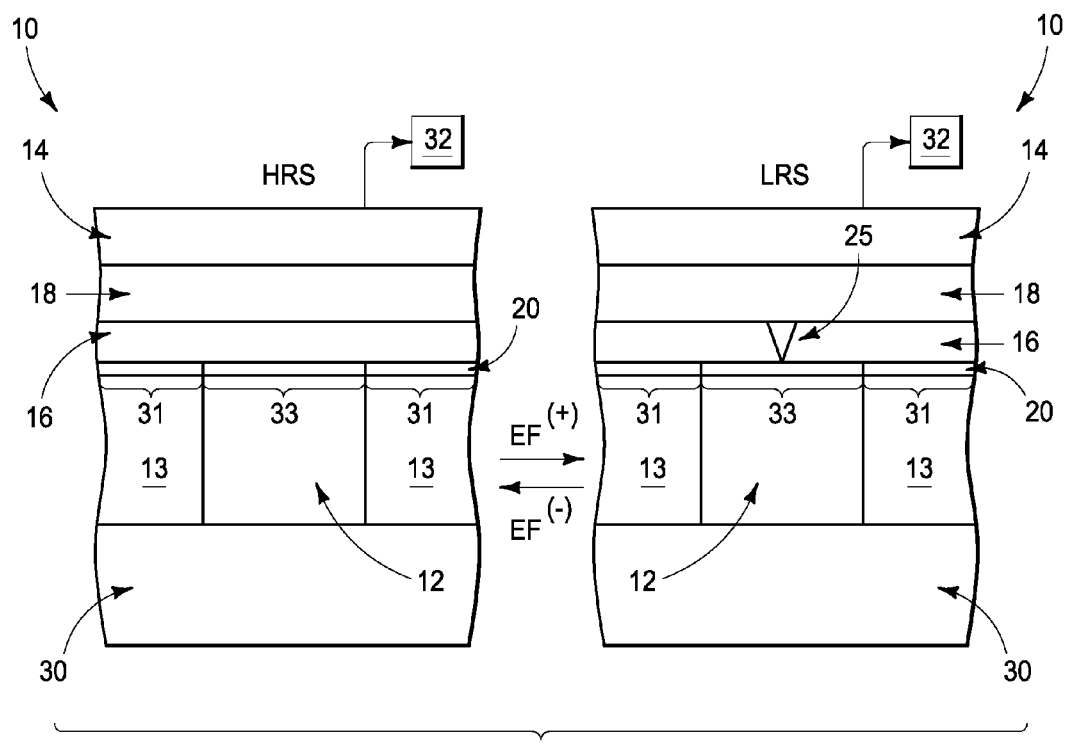
FIG. 1 shows an example embodiment PMC in cross-sectional side view reversibly transitioning between a low resistance state (LRS) and a high resistance state (HRS).

Referring to FIG. 1, a PMC (i.e., memory cell) 10 is illustrated in two modes corresponding to a high resistance state (HRS) and a low resistance state (LRS). The two modes are reversibly interchanged with one another through application of electric fields $EF^+$ and $EF^-$, with $EF^+$ being of opposite polarity relative to $EF^-$.

The PMC comprises a pair of electrodes 12 and 14, which in some embodiments may be referred to as a first electrode and a second electrode respectively. The PMC also comprises a switching material 16 and an ion reservoir material 18 between the electrodes. Additionally, the PMC comprises an intermediate material 20 between the first electrode 12 and the switching material 16. In the shown embodiment, the intermediate material 20 is directly against an upper surface of the electrode 12, and directly against a lower surface of the switching material 16.

Electrodes 12 and 14 may comprise any suitable conductive composition or combination of compositions; and may be the same composition as one another or may be different compositions relative to one another. In some embodiments, the electrodes may comprise, consist essentially of, or consist of one or more of various metals (for example, tungsten, titanium, ruthenium, tantalum, etc.) or metal-containing compositions (for instance, metal nitride, metal carbide, metal silicide, etc.). For instance, in some embodiments the electrode 12 may comprise, consist essentially of, or consist of a titanium-containing composition (for instance, titanium nitride); and the electrode 14 may comprise, consist essentially of, or consist of tungsten. As other illustrative examples, in some embodiments the electrode 12 may comprise one or more of ruthenium, tungsten and tantalum nitride.

In the shown embodiment, the electrode 12 extends through a dielectric material 13. In some embodiments, such dielectric material may comprise, consist essentially of, or consist of silicon nitride.

The memory cell 10 is shown to have the bottom electrode 12 connected to a conductive line 30, and to have the top electrode 14 connected to a conductive line 32 (diagrammatically illustrated with a box). The lines 30 and 32 may be sense and/or access lines coupled to the electrodes, and configured for providing appropriate electric fields across the memory cell during read/write operations. In some embodiments, the illustrated memory cell may be one of a plurality of memory cells of a memory array, and the lines 30 and 32 may be part of a circuit configuration utilized to uniquely address each of the memory cells of the array. In some embodiments, a "select device" (not shown) may be provided adjacent the memory cell 10 to reduce undesired current leakage to and/or from the memory cell during utilization of the memory cell in a memory array. Example select devices include diodes, transistors, ovonic threshold switches, etc. The select device may be provided between electrode 12 and the line 30 in some embodiments.

Although the electrodes 12 and 14 are shown to comprise homogeneous compositions, in other embodiments one or both of the electrodes may comprise multiple discrete compositions; and in some embodiments one or both of the electrodes may be a laminate of multiple electrically conductive compositions.

The line 30 may be supported by a semiconductor substrate (not shown). Such substrate may comprise, for example, monocrystalline silicon and/or other suitable semiconductor materials, and may be part of a semiconductor die. Accordingly the memory cell 10 may be part of an integrated circuit supported by a semiconductor chip.

The switching region 16 may be a solid, gel, or any other suitable phase, and may comprise chalcogenide-type materials (for instance, materials comprising one or more of tellurium, sulfur and selenium), oxides (for instance, aluminum oxide, zirconium oxide, hafnium oxide, tungsten oxide, silicon oxide, etc.) and/or any other suitable materials.

The ion reservoir material 18 contributes ions which ultimately form one or more conductive bridges 25 across the switching material 16. The ion reservoir material may comprise any suitable composition or combination of compositions. In some embodiments, the ion reservoir material may comprise one or more of aluminum, copper, silver and chalcogen (for instance, tellurium); and may be configured for contributing aluminum cations, copper cations and/or silver cations for formation of one or more conductive bridges. The conductive bridges may have any suitable configuration and may be filaments of conductive particles (for instance ions or ion clusters) in some embodiments.

In the shown embodiment, the conductive bridge 25 is diagrammatically illustrated as being entirely absent in the high resistance state (HRS) configuration of the memory cell. In other embodiments, a portion of the conductive bridge may remain in the HRS configuration of the memory cell.

Although the ion reservoir material is shown comprising a single composition, in other embodiments the ion reservoir material may comprise two or more different compositions. Similarly, although the switching material is shown comprising only a single composition, in other embodiments the switching material may comprise two or more different compositions.

The intermediate material 20 may stabilize the memory cell. For instance, the intermediate material may stabilize the conductive bridge 25 to improve retention and reliability of the memory cell relative to conventional memory cells lacking the intermediate material. Additionally, or alternatively, the intermediate material may function as a barrier between the switching material 16 and the electrode 12 to alleviate or preclude migration of chemical constituents from electrode 12 into switching material 16 and/or vice versa (for instance, the barrier may preclude undesired oxygen migration from an aluminum oxide-containing switching material to a metal-containing electrode). The intermediate material may comprise stabilizing species corresponding to one or both of carbon and boron. In some embodiments, the intermediate material may comprise, consist essentially of, or consist of one or both of carbon and boron.

In some embodiments, the stabilization provided by intermediate material 20 may improve durability of a memory cell (i.e., may extend the lifetime of the memory cell) as compared to conventional memory cells lacking the intermediate material 20. For instance, carbon of the intermediate material may form metal carbide when it interacts with metal of electrode 12; and such metal carbide may function, at least in part, as a protective layer proximate the interface of the electrode and the switching material. Similarly, boron of the intermediate material may form a protective metal boride.

The provision of stabilizing species corresponding to carbon and/or boron within the intermediate material 20, rather than dispersing such species throughout electrode 12, may enable conductive properties of electrode 12 to be maintained. Such may improve cell performance as compared to applications in which carbon and/or boron are dispersed throughout the entirety of the electrode 12.

The conductive bridge 25 is shown to extend to an upper surface of intermediate material 20, and in the illustrated embodiment does not penetrate into or through intermediate material 20. In other embodiments, the conductive bridge may extend at least partially through the intermediate material 20.

The intermediate material 20 may be kept thin so that resistive properties of the intermediate material impact cell performance only marginally, if at all. For instance, in some embodiments the intermediate material may comprise a thickness within a range of from greater than 0 Å to less than or equal to about 50 Å; and in some embodiments may comprise a thickness within a range of from greater than or equal to about 10 Å to less than or equal to about 50 Å.

In some embodiments, utilization of the intermediate material 20 may enable conductivity of electrode 12 to be enhanced by enabling relatively exotic materials to be utilized in the electrode 12. Specifically, the barrier properties of intermediate material 20 may enable materials to be utilized for electrode 12 that could not be utilized in conventional memory cells lacking intermediate material 20.

In some embodiments, the intermediate material 20 may be formed only over electrode 12 and not over dielectric material 13. In some embodiments, the intermediate material 20 may be deposited across both of electrode 12 and dielectric material 13, and may have a same composition across the dielectric material as across the electrode. In some embodiments, at least a portion of the intermediate material may be formed by implanting carbon and/or boron into materials 12 and 13. In such embodiments, the intermediate material 20 may comprise a first composition over electrode 12 containing the stabilizing species interspersed with material of electrode 12, and may comprise a second composition over dielectric 13 containing the stabilizing species interspersed with material of dielectric 13. Accordingly, the intermediate material 20 may comprise two different types of regions 31 and 33 (as shown), which differ in composition relative to one another. For instance, if electrode 12 comprises titanium nitride, the region 33 may comprise boron and/or carbon interspersed with titanium nitride; and if dielectric 13 comprises silicon nitride, the region 31 may comprise boron and/or carbon interspersed with silicon nitride. The composition within region 33 may comprise a total concentration of stabilizing species (i.e. boron and/or carbon) within a range of from about 15 atomic percent to about 100 atomic percent; in some embodiments within a range of from about 90 atomic percent to about 100 atomic percent; and in some embodiments about 100 atomic percent. The composition within region 31 may comprise a similar total concentration of the stabilizing species.

Figure 2:
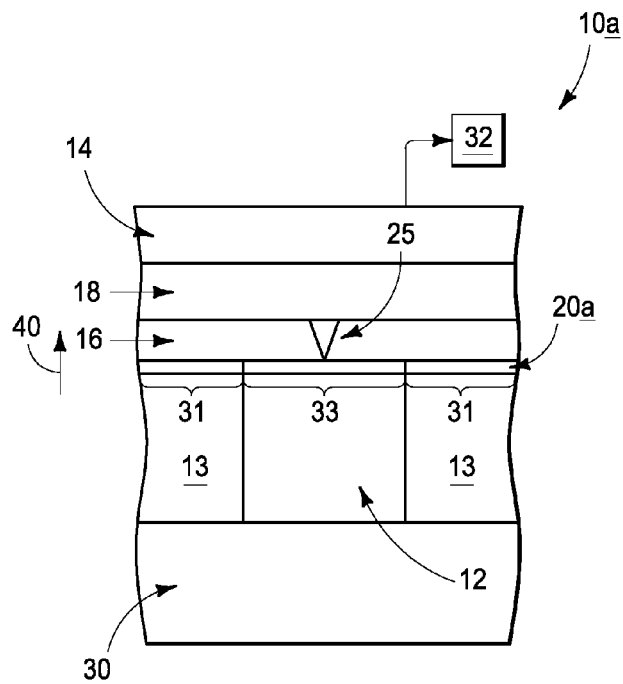
FIG. 2 shows an example embodiment memory cell in cross-sectional side view.

In some embodiments, the region 33 may comprise a uniform composition of the stabilizing species. In other embodiments, the region 33 may comprise a gradient of the stabilizing species composition as shown in FIG. 2. Specifically, FIG. 2 shows a memory cell 10a comprising a gradient of stabilizing species concentration (indicated by the arrow 40) within an intermediate material 20a. The illustrated gradient increases in a direction from the first electrode 12 to the switching material 16. In some embodiments, an upper surface of the intermediate material 20a directly against the switching material 16 may comprise a total concentration of stabilizing species (i.e., carbon and/or boron) of from about 90 atomic percent to about 100 atomic percent, and a bottom surface of the intermediate material directly against the first electrode 12 may comprise a total concentration of the stabilizing species of from about 0 atomic percent to less than or equal to about 10 atomic percent (and in some embodiments to less than or equal to about 5 atomic percent). Similarly, an upper portion of region 31 of the intermediate material may comprise from about 95% to about 100 atomic percent of stabilizing species, and a lower portion may comprise from about zero atomic percent to less or equal to about 10 atomic percent of the stabilizing species, with the stabilizing species in the lower portion being dispersed within a dielectric composition of material 13.

The region 33 of the intermediate material 20a may comprise stabilizing species implanted over and within the composition of electrode 12. The gradient of FIG. 2 may enable a thin upper region of the intermediate material to have the stabilizing properties associated with a high concentration of boron and/or carbon, and may enable a remainder of the intermediate material to have higher conductivity associated with an increased concentration of the composition of electrode 12. Thus, the gradient of FIG. 2 may enable an intermediate material to be formed having improved conductive properties relative to the homogeneous intermediate material of FIG. 1.

The memory cell 10a is illustrated in a high resistance state, and accordingly the conductive bridge 25 (FIG. 1) is not shown.

The memory cells described above may be formed utilizing any suitable processing. An example method of forming memory cell 10 is described with reference to FIGS. 3-7.

Figure 3:
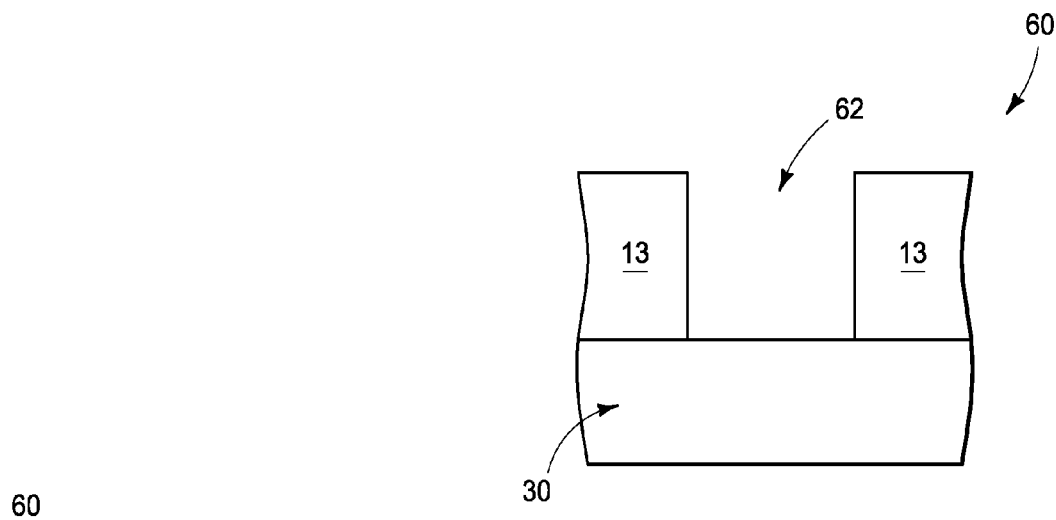
FIGS. 3-7 show a semiconductor construction in cross-sectional side view, and illustrate process stages of an example embodiment process for forming an example embodiment memory cell.

Referring to FIG. 3, a construction 60 is shown at a processing stage in which an opening 62 has been formed to extend through dielectric material 13 to an upper surface of the electrically conductive line 30. The opening 62 may be formed with any suitable processing. For instance, a mask (not shown) may be formed over material 13 to define a location of opening 62, the opening may be transferred through material 13 with one or more suitable etches, and then the mask may be removed to leave the shown construction of FIG. 3. The mask may comprise any suitable mask; including, for example, a photolithographically-patterned photoresist mask and/or a mask formed utilizing pitch multiplication methodologies.

Figure 4:
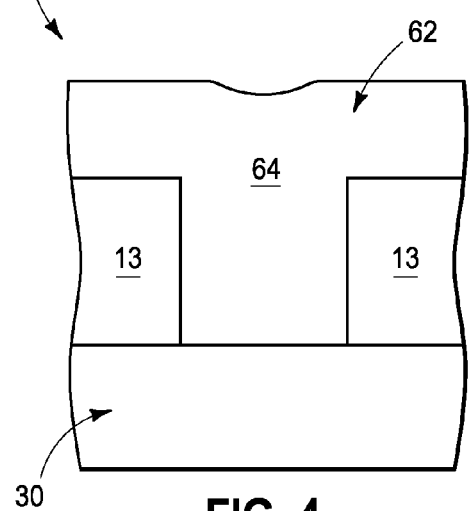

Referring to FIG. 4, material 64 is formed within opening 62. The material 64 may comprise any of the compositions discussed above with reference to FIG. 1 as being suitable for electrode 12.

Figure 5:
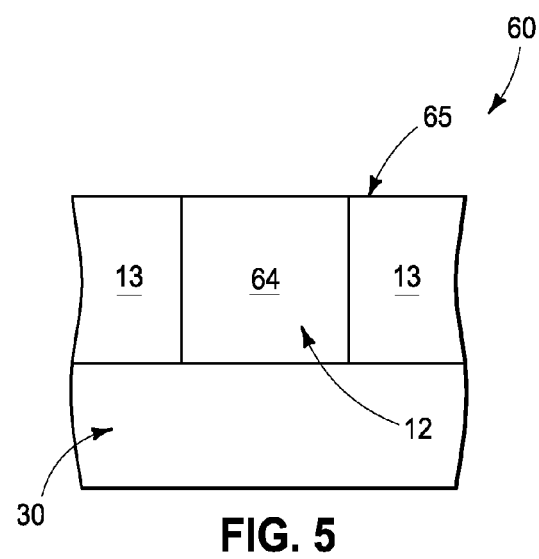

Referring to FIG. 5, material 64 is subjected to planarization (for instance, chemical-mechanical polishing) to form a planarized surface 65 extending across materials 13 and 64. Such patterns material 64 into the electrode 12.

Figure 6:
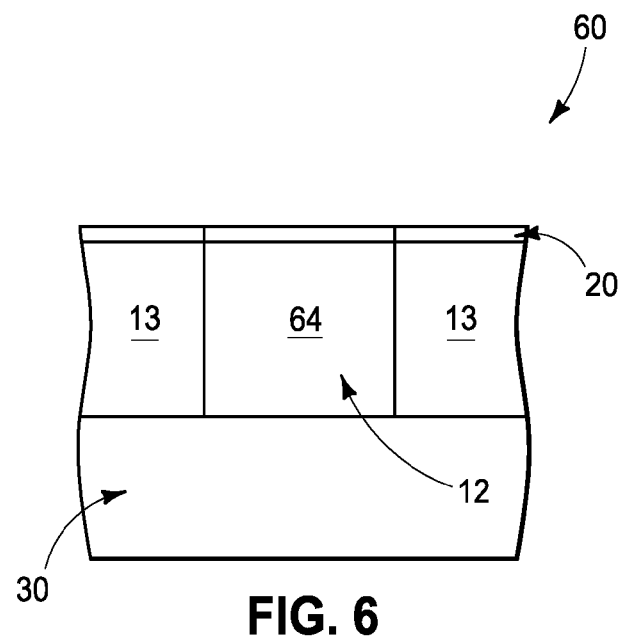

Referring to FIG. 6, intermediate material 20 is formed over materials 13 and 64; with such intermediate material comprising one or both of carbon and boron. The intermediate material may be formed utilizing any suitable processing, including, for example, one or more of atomic layer deposition (ALD), chemical vapor deposition (CVD) and physical vapor deposition (PVD). In some embodiments, at least some of material 20 may be formed utilizing plasma doping (PLAD). Specifically, construction 60 may be provided within a plasma and then suitable ions of the stabilizing species (specifically, carbon and/or boron) are implanted into the construction to form intermediate material 20. Such implant may form a homogeneous material, or may form a non-homogeneous material. In some embodiments, the implant may form a gradient of the type described above with reference to FIG. 2. If it is desired to have the upper surface of material 20 having a higher concentration of the stabilizing species than is achieved by the implant, a deposition may be conducted after the implant to form an upper surface of material 20 comprising about 100 atomic percent of the stabilizing species.

In some embodiments, the plasma doping may utilize an energy of from about 30 electron volts (eV) to about 10,000 eV; such as, for example, from about 100 eV to about 500 eV. In some embodiments the plasma doping may utilize a dose of from about $1\times10^{13}$ ions/cm$^2$ to about $1\times10^{17}$ ions/cm$^2$; such as, for example, a dose of about $1\times10^{15}$ ions/cm$^2$. In some embodiments, low energy PLAD may provide desired capabilities of tuning and implant characteristics, particularly in a sub-3 KeV regime.

Figure 7:
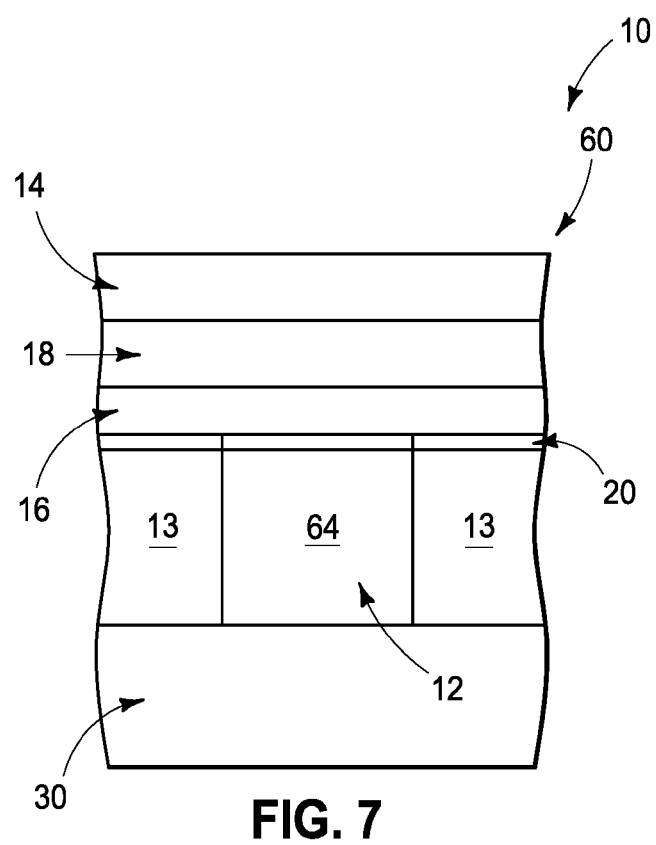

Referring to FIG. 7, the switching material 16 is formed over and directly against the intermediate material 20, the ion reservoir material 18 is formed over the switching material 16, and the top electrode 14 is formed over the ion reservoir material 18. Accordingly, the memory cell 10 is formed.

The memory cells discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a memory cell comprises a first electrode, and an intermediate material over and directly against the first electrode. The intermediate material comprises stabilizing species corresponding to one or both of carbon and boron. The memory cell also comprises a switching material over and directly against the intermediate material, an ion reservoir material over the switching material, and a second electrode over the ion reservoir material.

In some embodiments, a memory cell comprises a first electrode, and an intermediate material over and directly against the first electrode. The intermediate material comprising stabilizing species corresponding to one or both of carbon and boron. The memory cell also comprises a switching material over and directly against the intermediate material, an ion reservoir material over the switching material, and a second electrode over the ion reservoir material. The intermediate material comprises a gradient of stabilizing species concentration, with said concentration being lowest directly adjacent the first electrode and being highest directly adjacent the switching material.

In some embodiments, a method of forming a memory cell comprises forming an intermediate material over and directly against a first electrode, with the intermediate material comprising stabilizing species corresponding to one or both of carbon and boron. A switching material is formed over and directly against the intermediate material. An ion reservoir material is formed over the switching material. A second electrode is formed over the ion reservoir material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
   a first electrode comprising titanium;
   an intermediate material over and directly against the first electrode, the intermediate material comprising stabilizing species corresponding to one or both of carbon and boron;
   a switching material over and directly against the intermediate material;
   an ion reservoir material over the switching material;
   a second electrode over the ion reservoir material, the second electrode comprising tungsten; and
   wherein the intermediate material comprises a gradient of stabilizing species concentration, with said concentration being lowest directly adjacent the first electrode and being highest directly adjacent the switching material.

2. The memory cell of claim 1 wherein the intermediate material comprises a thickness within a range of from greater than 0 angstroms to less than or equal to about 50 angstroms.

3. The memory cell of claim 1 wherein the intermediate material comprises a thickness within a range of from greater than or equal to about 10 angstroms to less than or equal to about 50 angstroms.

4. The memory cell of claim 1 wherein a surface of the intermediate material directly against the switching material comprises a total concentration of said stabilizing species of from about 15 atomic percent to about 100 atomic percent.

5. The memory cell of claim 1 wherein a surface of the intermediate material directly against the switching material comprises a total concentration of said stabilizing species of from about 90 atomic percent to about 100 atomic percent.

6. The memory cell of claim 1 wherein a surface of the intermediate material directly against the switching material comprises a total concentration of said stabilizing species of about 100 atomic percent.

7. The memory cell of claim 1 wherein:
   a surface of the intermediate material directly against the switching material comprises a total concentration of said stabilizing species of from about 90 atomic percent to about 100 atomic percent; and
   a surface of the intermediate material directly against the first electrode comprises a total concentration of said stabilizing species of from about 0 atomic percent to less than or equal to about 10 atomic percent.

8. The memory cell of claim 1 wherein the intermediate material comprises carbon.

9. The memory cell of claim 1 wherein the intermediate material comprises boron.

10. The memory cell of claim 1 wherein the intermediate material comprises carbon and boron.

\* \* \* \* \*